(12) United States Patent
Yoshihara et al.

(10) Patent No.: US 8,287,954 B2
(45) Date of Patent: Oct. 16, 2012

(54) APPARATUS AND METHOD OF FORMING AN APPLIED FILM

(75) Inventors: Kousuke Yoshihara, Koshi (JP); Hiroichi Inada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/859,790

(22) Filed: Aug. 20, 2010

(65) Prior Publication Data

US 2011/0008538 A1    Jan. 13, 2011

Related U.S. Application Data

(62) Division of application No. 11/501,740, filed on Aug. 10, 2006, now Pat. No. 7,802,536.

(30) Foreign Application Priority Data

Aug. 30, 2005    (JP) .................................. 2005-249299

(51) Int. Cl.
*B05D 3/12* (2006.01)
(52) U.S. Cl. .......... 427/240; 427/425; 118/52; 118/320; 118/326; 438/780; 438/782
(58) Field of Classification Search .................. 427/240, 427/425; 118/52, 320, 326; 438/758, 780, 438/782
See application file for complete search history.

(56) References Cited

U.S. PATENT DOCUMENTS

| 5,762,708 | A | | 6/1998 | Motoda et al. |
| 5,762,709 | A | * | 6/1998 | Sugimoto et al. ............... 118/52 |
| 5,997,653 | A | | 12/1999 | Yamasaka |
| 6,527,860 | B1 | | 3/2003 | Yoshihara et al. |
| 7,575,634 | B2 | | 8/2009 | Shite |
| 2001/0003965 | A1 | | 6/2001 | Sada et al. |
| 2001/0014224 | A1 | * | 8/2001 | Hasebe et al. ................. 396/579 |
| 2004/0083953 | A1 | | 5/2004 | Collins et al. |

FOREIGN PATENT DOCUMENTS

| JP | 4-359507 | 12/1992 |
| JP | 5-234874 | 9/1993 |
| JP | 7-142378 | 6/1995 |
| JP | 7-320999 | 12/1995 |
| JP | 10-172951 | 6/1998 |
| JP | 2000-124099 | 4/2000 |
| JP | 2000-200749 | 7/2000 |
| JP | 2000-232050 | 8/2000 |
| JP | 2004-207573 | 7/2004 |
| JP | 2005-11996 | 1/2005 |
| JP | 2005-229115 | 8/2005 |

* cited by examiner

*Primary Examiner* — Kirsten Jolley
(74) *Attorney, Agent, or Firm* — Oblon, Spivak, McClelland, Maier & Neustadt, L.L.P.

(57) ABSTRACT

There is provided an apparatus including: a processing cup having an opening opened upward to allow a substrate to be loaded and unloaded, an exhaust port for exhausting an unnecessary atmosphere produced in forming a film applied on the substrate, and an aspiration port for aspirating external air; and an aspiration device aspirating the unnecessary atmosphere through the exhaust port, wherein when the substrate is accommodated in the opening of the processing cup, the substrate has a perimeter spaced from the opening by a predetermined gap, and below the substrate accommodated in the processing cup there is formed an exhaust flow path extending from the aspiration port to the exhaust port.

6 Claims, 7 Drawing Sheets

APPARATUS AND METHOD OF FORMING AN APPLIED FILM

CROSS REFERENCE TO RELATED APPLICATIONS

This application is a divisional application of pending U.S. application Ser. No. 11/501,740 filed Aug. 10, 2006, which is herein incorporated by reference. Further, parent application Ser. No. 11/501,740 claims priority to Japanese Patent Application No. 2005-249299, filed Aug. 30, 2005.

BACKGROUND OF THE INVENTION

1. Field of the Invention

The present invention relates generally to apparatuses and methods of forming a film of liquid applied on a substrate and particularly to apparatuses dropping a liquid to be applied on an upper surface of a substrate held substantially horizontally and rotated as controlled to disperse the liquid in the form of a film to form a film to be applied and methods of forming such film.

2. Description of the Background Art

In fabricating a semiconductor device a photolithography process is performed including, e.g., the step of applying resist liquid serving as a liquid to be applied on a semiconductor wafer (hereinafter simply referred to as a "wafer") serving as a substrate to be processed to form a film of the resist, the step of exposing the film of the resist to form the film of the resist in a predetermined pattern, the step of heating the exposed film of the resist to promote a chemical reaction therein (i.e., the step of post-exposure baking), the step of developing the exposed film of the resist, and the like in order to form a predetermined pattern of the resist on the wafer.

Of the series of process steps, the step of applying the resist is performed for example in a well-known apparatus employing spin-coating to form an applied film, as indicated in Japanese Patent Laying-Open No. 07-320999. FIG. 7 shows in configuration the apparatus indicated in the document such that it is partially simplified. FIG. 7 shows an apparatus 200 forming an applied film. More specifically, a spin chuck 201 with a wafer W placed and thus fixed thereon is rotated and a solvent (thinner or the like) serving as a solvent for resist liquid is initially dropped at a center of an upper surface of wafer W from a solvent feeding mechanism 202 through a nozzle 203 and thus dispersed, and the resist liquid is then dropped by a resist feeding mechanism 204 through a nozzle 205. The dropped resist liquid is dispersed from the center of the wafer toward the perimeter of the wafer spirally by the rotational force of wafer W and the centrifugal force and thus applied on the wafer.

When spin-coating is employed to perform an application process, as indicated in the document, the resist liquid dispersed on wafer W that is excessive is spun away from wafer W by the force of rotation of wafer W. Of the resist liquid spun and thus scattered away, a portion is accommodated in an application cup 206 and a portion forms an atmosphere in the form of a mist around wafer W. Accordingly the configuration indicated in the document has an exhaust port 207 under application cup 206 to aspirate therethrough the mist formed around wafer W.

The configuration with application cup 206 having an upper portion open and exhaust port 207 located under wafer W, as shown in FIG. 7, however, forms an exhaust flow path which affects the film to be uneven in thickness, and this is a technological issue to be addressed.

More specifically, when the mist formed around wafer W is aspirated through exhaust port 207, as shown in the figure, the mist is aspirated together with external air present above wafer W. This forms a downward exhaust flow path. As a result, wafer W receives larger wind pressure at the perimeter than at the center. The perimeter is thus dried faster and on the dried resist the resist liquid is further applied resulting in wafer W having a film thereon larger in thickness at the perimeter than at the center.

Furthermore, as shown in FIG. 7, between application cup 206 and wafer W a large gap G is formed. As such, the mist also leaks and thus moves to above wafer W. Accordingly, aspirating through exhaust port 207 all of the mist having moved to above wafer W requires powerful aspiration, which is also an issue to be addressed.

Furthermore, measuring an amount of exhaust in the configuration of FIG. 7 requires that an anemometer, a flowmeter and/or the like be arranged in the exhaust flow path downstream, i.e., at exhaust port 207 or the like. In that case, however, the measuring instrument is contaminated by the mist and cannot measure the amount of exhaust precisely.

SUMMARY OF THE INVENTION

The present invention contemplates an apparatus that drops a liquid to be applied on an upper surface of a substrate substantially horizontally held and rotated as controlled and by the force caused by the rotated substrate disperses the liquid in the form of a film to form an applied film, that can form the film uniformly in thickness and can also reduce the liquid in the form of mist scattering around the substrate in forming the film that leaks to above the substrate, and also reduce aspiration required to exhaust the liquid in the form of the mist, and also measure an amount of exhaust with precision, and a method of forming such applied film.

The present invention provides an apparatus that drops on a substrate a liquid to be applied thereon and rotates the substrate to cause a force to disperse the liquid in a form of a film to form a film applied on an upper surface of the substrate, including: a substrate holding and rotating device substantially horizontally holding and thus rotating the substrate; a device feeding the liquid to be applied, dropping the liquid to be applied onto the upper surface of the substrate; a processing cup having an opening opened upward to allow the substrate to be loaded and unloaded, an exhaust port for exhausting an unnecessary atmosphere produced in forming the film applied on the substrate, and an aspiration port for aspirating external air; and an aspiration device aspirating the unnecessary atmosphere through the exhaust port, wherein when the substrate is accommodated in the opening of the processing cup, the substrate has a perimeter spaced from the opening by a predetermined gap and substantially separates a processing space located above the substrate and a space located below the substrate, and below the substrate accommodated in the processing cup there is formed an exhaust flow path extending from the aspiration port to the exhaust port, with the gap and the exhaust flow path communicating with each other.

In the present apparatus preferably the perimeter of the substrate and the opening are spaced by a gap of at most 3 mm in a radial direction of the substrate and a gap within a range of 0.5 mm to 2 mm in a direction of a height of the substrate and the perimeter of the substrate is lower in level than the opening of the processing cup.

The processing cup and the substrate having the opening and the perimeter, respectively, with a predetermined space interposed therebetween as described above can separate a processing space located above the substrate for applying a liquid thereon, and a space located below the substrate for exhaust and effluent. This can reduce or prevent an unnecessary atmosphere containing the applied liquid that forms a mist in the processing cup and thus leaks above the substrate.

Furthermore the processing cup that is provided with the aspiration port for aspirating external air and the exhaust port for exhausting air outside the processing cup can have an exhaust flow path formed therein. Even with small aspiration, the mist formed in the process forming an applied film can be exhausted.

Furthermore in the above described configuration there is not external air intensely flowing in from the opening of the processing cup as air is exhausted, and the substrate can have a perimeter with the resist less dried. A film of the resist that is excellently uniform in thickness can thus be obtained.

In the present apparatus preferably the aspiration port is provided with a sensor measuring aspirated air in flow rate.

Furthermore the sensor sensing the amount of air aspirated that is provided at the aspiration port located upstream in the exhaust flow path can be protected from contamination by the mist and thus measure the aspirated air in flow rate with precision. Furthermore, as the gap formed between the opening of the processing cup and the perimeter of the substrate introduces atmosphere in a small amount, the air aspirated and the air exhausted are substantially equal in flow rate. Furthermore, no contamination contributes to reduced cost for maintenance.

In the present apparatus preferably in the exhaust flow path downstream of the sensor a backflow preventing portion is provided to prevent the unnecessary atmosphere from flowing backward into the aspiration port.

Thus if an aspiration device aspirating a mist acting as an unnecessary atmosphere is not driven and thus stops, the backflow preventing portion can reduce or prevent the mist flowing back into the aspiration port and contaminating the sensor.

Preferably the present apparatus further includes a lid engaged with an upper portion of the processing cup for forming the processing space located above the substrate and substantially sealed.

Preferably the present apparatus further includes an atmosphere control device feeding the processing space with a solvent for the liquid in a form of a mist, wherein while the atmosphere control device feeds the processing space with the solvent in the mist, the liquid to be applied dropped by the device feeding the liquid to be applied is dispersed as the substrate holding and rotating device rotates the substrate.

This can suppress evaporation of the solvent dispersed in forming an applied film and thus prevent the substrate from having a perimeter with the dispersed applied liquid dried and thus solidified thereon.

Thus the applied liquid can form a film uniform in thickness, and the liquid can also be reduced in amount for use and exhaust and effluent can also be reduced in amount.

The present invention provides a method of forming an applied film, dropping on a substrate a liquid to be applied thereon, and rotating the substrate to cause a force to disperse the liquid in a form of a film to form a film applied on an upper surface of the substrate, including the step of: substantially horizontally holding the substrate on a substrate holding and rotating device; dropping the liquid on an upper surface of the substrate rotating on the substrate holding and rotating device; and exhausting an unnecessary atmosphere produced in forming the film applied on the substrate, wherein the step of exhausting is performed such that a processing space located above the substrate and a space located below the substrate are substantially separated.

A processing space located above the substrate for applying a liquid thereon, and a space located below the substrate for exhaust and effluent can be separated. This can reduce or prevent an unnecessary atmosphere leaking above the substrate.

In the present method preferably the step of dropping is performed such that the processing space located above the substrate is substantially sealed.

In the present method preferably the step of dropping includes the step of feeding the processing space with a solvent for the liquid in a form or a mist and with the solvent fed in the mist the liquid is dispersed as the substrate is rotated.

This can suppress evaporation of the solvent dispersed in forming an applied film and thus prevent the substrate from having a perimeter with the dispersed applied liquid dried and thus solidified thereon.

Thus the applied liquid can form a film uniform in thickness, and the liquid can also be reduced in amount for use and exhaust and effluent can also be reduced in amount.

The present invention can thus provide an apparatus that drops a liquid to be applied on an upper surface of a substrate substantially horizontally held and rotated as controlled and by the force caused by the rotated substrate disperses the liquid in the form of a film to form an applied film, that can form the film uniformly in thickness and can also reduce the liquid in the form of mist scattering around the substrate in forming the film that leaks to above the substrate, and also reduce aspiration required to exhaust the liquid in the form of the mist, and also measure an amount of exhaust with precision, and a method of forming such applied film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Hereinafter the present apparatus forming an applied film will be described with reference to an embodiment shown in the figures.

Figure 1:
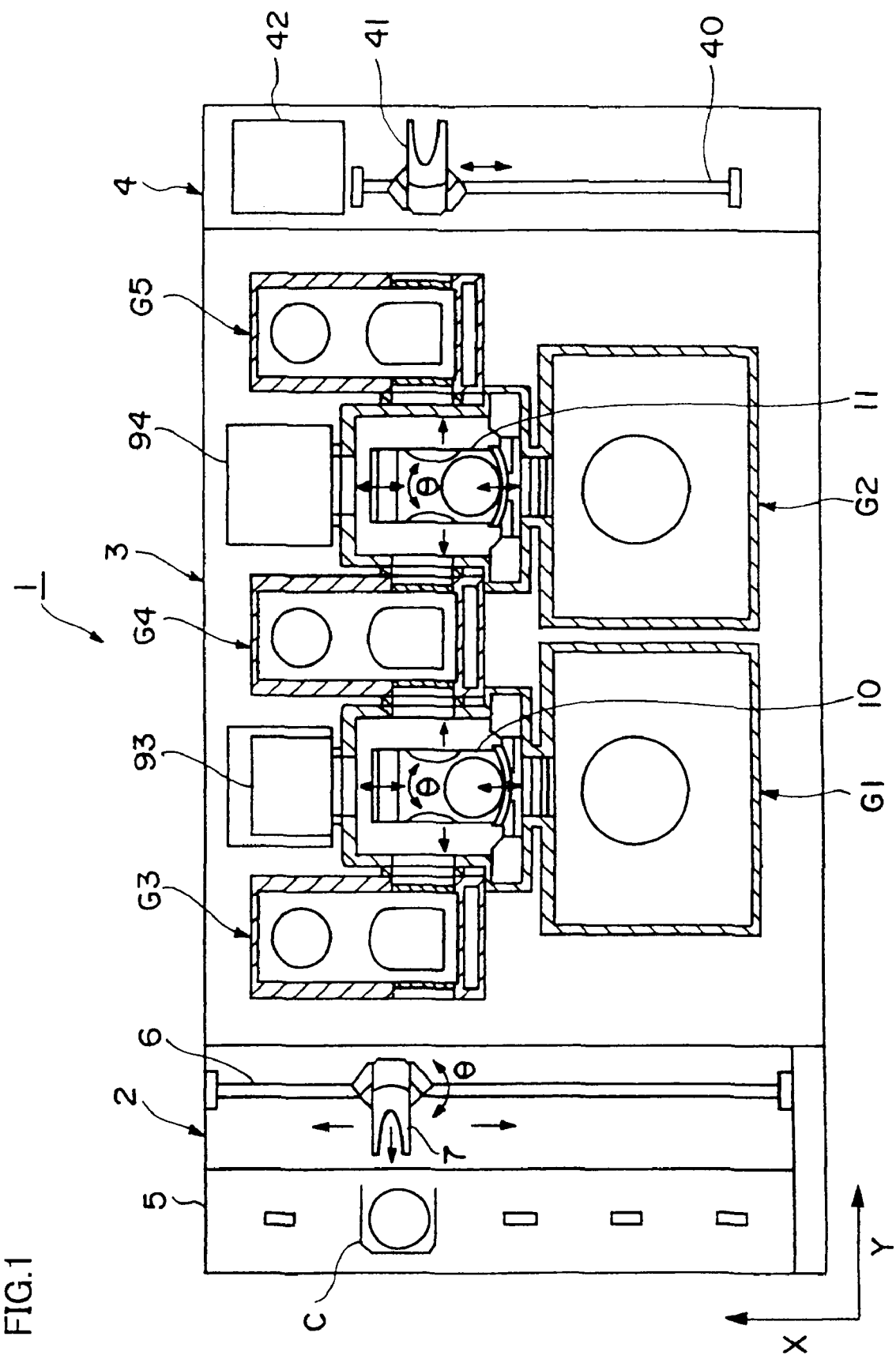
FIG. 1 is a plan view schematically showing a configuration of a resist application and development system equipped with a resist application process unit serving as the present apparatus forming an applied film.

As shown in FIG. 1 a resist application and development system 1 is configured such that a cassette station 2 loading and unloading 25 wafers Ws, for example, externally into and from resist application and development system 1 in cassettes and loading and unloading wafer W into and from a cassette C, a processing station 3 having a plurality of processing units arranged in multiple stages to perform a predetermined process in a photolithography process in a single wafer processing, and an interface portion 4 passing and receiving wafer W to and from an exposure device (not shown) provided adjacent to processing station 3 are integrally connected together.

Cassette station 2 is provided with a cassette platform 5 such that a plurality of cassettes Cs can be placed thereon in a direction X (in FIG. 1, the upward/downward direction) in a row. Furthermore, cassette station 2 is provided with a wafer carriage 7 movable on a carrier path 6 in the direction X. Wafer carriage 7 is adapted to be also movable in a direction in which wafer W accommodated in cassette 7 is arranged (i.e., a direction Z, or the direction orthogonal to the direction of the sheet of FIG. 1), and is adapted to selectively access wafer W of each cassette arranged along the X axis.

Furthermore, wafer carriage 7 is adapted to be rotatable around the Z axis in a direction θ and also capable of accessing a temperature adjustment unit 60, a transition unit 61 and the like belonging to a third processing device group G3 associated with processing station 3 described later.

Cassette station 2 is adjacent to processing station 3, which includes for example five processing device groups G1-G5 having a plurality of processing devices arranged in multiple stages.

In processing station 3 at a lower side in FIG. 1, adjacent to cassette station 2 is arranged a first processing device group G1, followed by a second processing device group G2. Furthermore, at an upper portion in FIG. 1, adjacent to cassette station 2 is arranged a third processing device group G3, followed by a fourth processing device group G4 and a fifth processing device group G5 in order.

Furthermore between the third and fourth processing device groups G3 and G4 is provided a first transport device 10 adapted to be capable of selectively accessing each processing device in the first, third and fourth processing device groups G1, G3 and G4 to transport wafer W.

Furthermore between the fourth and fifth processing device groups G4 and G5 is provided a second transport device 11 adapted to be capable of selectively accessing each processing device in the second, fourth and fifth processing device groups G2, G4 and G5 to transport wafer W.

Figure 2:
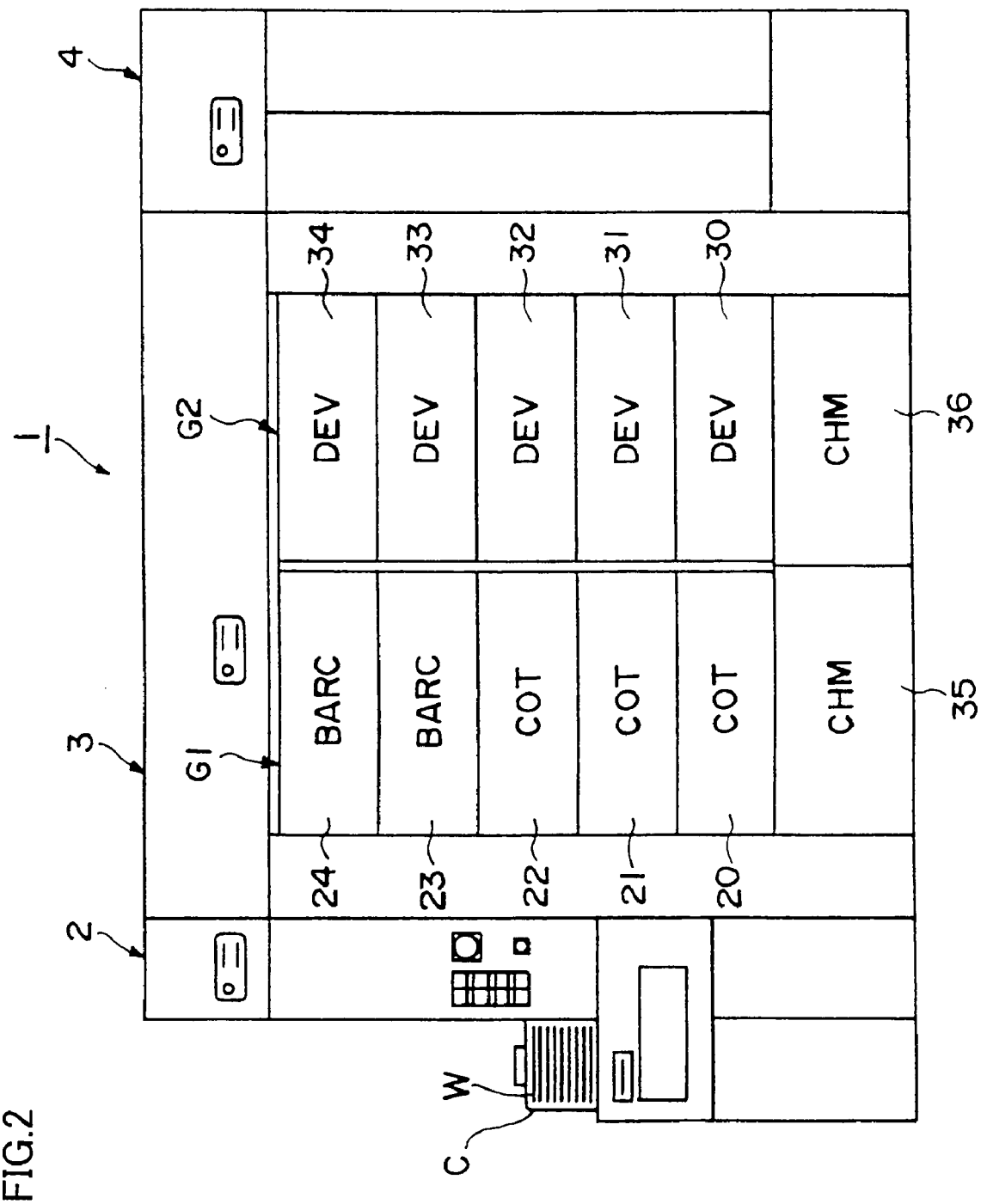
FIGS. 2 and 3 are front and rear views, respectively, of the resist application and development system shown in FIG. 1.

Furthermore in the first processing device group G1 liquid processing devices feeding wafer W with a predetermined liquid to perform a process, e.g., as shown FIG. 2, resist application process units (COTs) 20, 21, 22 applying a resist liquid on wafer W, bottom coating units (BARCs) 23, 24 forming an anti reflection film preventing a reflection of light in an exposure process are stacked upward in order in five stages.

Furthermore in the second processing device group G2 liquid processing devices, e.g., development process units (DEVs) 30-34 for example feeding wafer W with developer to perform a development process are stacked upward in order in five stages.

Furthermore in the first and second processing device groups G1 and G2 at their respective bottom most stages chemical chambers (CHMs) 35 and 36 are respectively provided to feed a variety of processing liquids to liquid processing devices in processing device groups G1 and G2.

Figure 3:
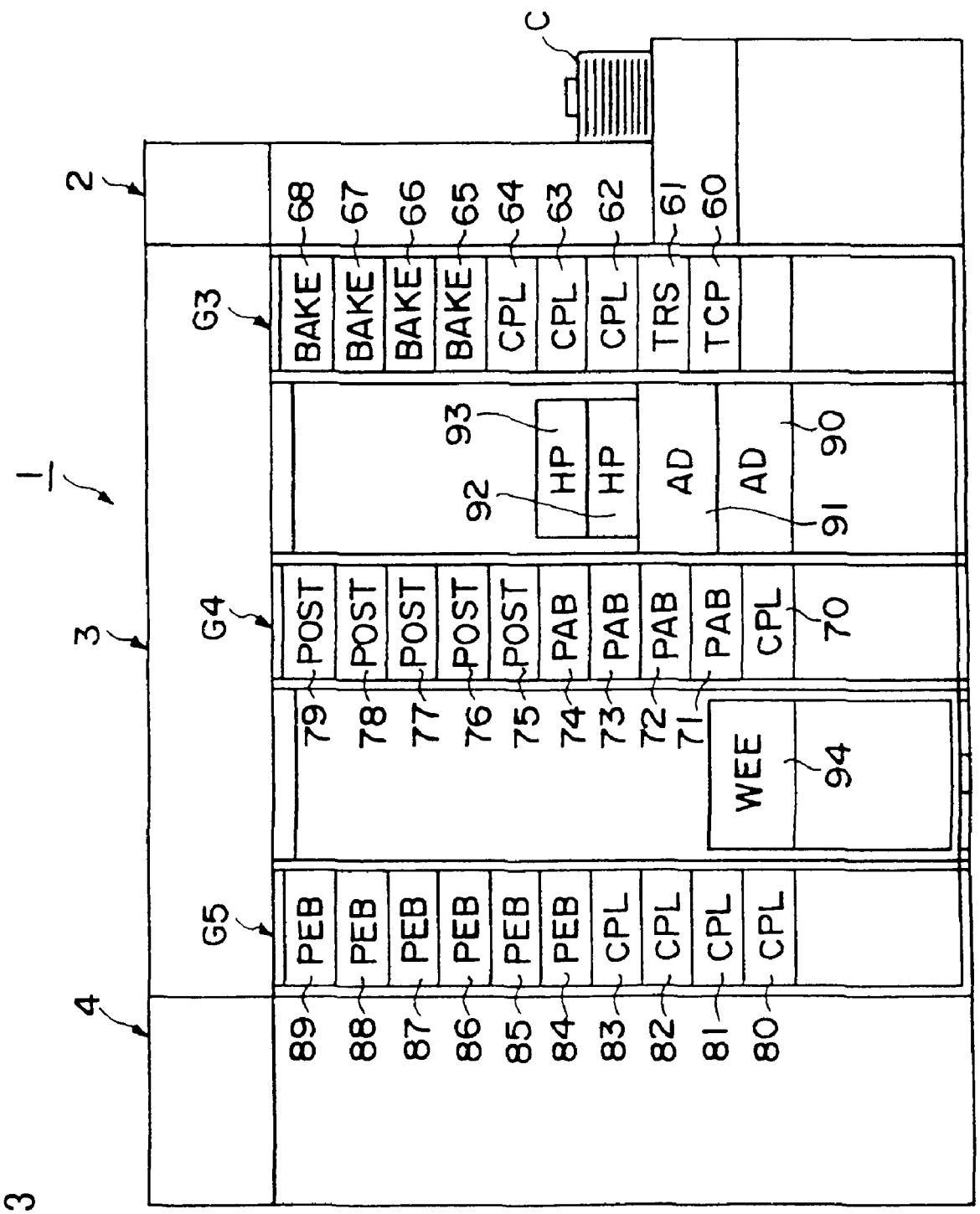

Furthermore, as shown in FIG. 3, in third processing device group G3 temperature adjustment unit (TCP) 60, transition unit (TRS) 61 passing and receiving wafer W, high-precision temperature adjustment units (CPLs) 62-64 adjusting wafer W in temperature as temperature is controlled with high precision, and thermal processing units (BAKEs) 65-68 exposing wafer W to high temperature to heat and thus process wafer W are stacked in order in nine stages.

In the fourth processing device group G4 for example a high-precision temperature adjustment unit (CPL) 70, pre-baking units (PABs) 71-74 heating and thus processing wafer W having resist applied thereon, post-baking units (POSTs) 75-79 heating and thus processing wafer W having undergone the development process are stacked upward in order in 10 stages.

Furthermore in the fifth processing device group G5 a plurality of thermal processing devices thermally processing wafer W, e.g., high-precision temperature adjustment units (CPLs) 80-83 and a plurality of post-exposure baking units (PEBs) 84-89 heating and thus processing wafer W having been exposed are stacked upward in order in 10 stages.

Furthermore at a positive side of the first transport device 10 (see FIG. 1) in direction X a plurality of processing devices, e.g., as shown in FIG. 3, adhesion units (ADs) 90, 91 processing wafer W to be hydrophobic and heating units (HPs) 92, 93, heating wafer W are stacked upward in order in four stages.

Furthermore at a positive side of the second transport device 11 (see FIG. 1) in direction X a perimeter exposure unit (WEE) 94 is arranged for example to expose wafer W only at an edge selectively.

Furthermore, interface portion 4 is provided with a wafer carriage 41 moving on a carrier path 40 extending in direction X, and a buffer cassette 42, as shown in FIG. 1. Wafer carriage 41 is adapted to be also movable in direction Z and rotatable in direction θ and capable of accessing the exposure device (not shown) adjacent to interface portion 4, buffer cassette 42 and the fifth processing device group G5 to transport wafer W.

Resist application and development system 1 thus configured allows a series of photolithography process steps as will be described hereinafter.

Initially in cassette station 2 a single wafer W is transported from cassette C, which accommodates wafer W to be processed, by wafer carriage 7 to the third processing device group G3 and loaded into transition unit (TRS) 61. Therein wafer W is registered and subsequently transported to adhesion units (ADs) 90, 91 and thus processed to be hydrophobic. Then the wafer undergoes a predetermined cooling process in high-precision temperature adjustment units (CPLs) 62-64 and is then transported to the first processing device group G1 and loaded into resist application process units (COTs) 20-22 to have a surface subjected to a resist application process. Note that from transition device 61 to resist application devices 20-22 wafer W is transported by the first transport device 10.

Then wafer W is transported by the first transport device 10 to the fourth processing device group G4 and loaded into pre-baking devices 71-74 and thus heated as predetermined, i.e., pre-baked. Wafer W prebaked is transported to perimeter exposure unit (WEE) 94 and exposed only at an edge.

Thereafter wafer W is transported to the fifth processing device group G5 and loaded into high-precision temperature adjustment units (CPLs) 80-83 and cooled therein, and then carried in interface portion 4 by wafer carriage 41 into buffer cassette 42 and thus temporarily stored therein.

Wafer W temporarily held in buffer cassette 42 is ejected by wafer carriage 41 and passed to the exposure device (not shown) and exposed therein.

Wafer W having been exposed is again transported via interface portion 4 to the fifth processing device group G5 and loaded into post-exposure baking units (PEBs) 84-89 to undergo a post-exposure heating process.

Then wafer W is transported by the second transport device 11 to the second processing device group G2 and loaded into development process devices 30-34 and thus developed therein, and then transported to the fourth processing device group G4 and loaded into post-baking units (POSTs) 75-79 and therein undergoes a post-development heating process. Then wafer W is transported to the third processing device group G3 and loaded into high-precision temperature adjustment units (CPLs) 62-64 and cooled therein, and then returned by wafer carriage 7 to cassette C.

Resist application process units (COTs) 20-22 serving as the present apparatus forming an applied film, will now be described more specifically. Note that a plurality of resist application process units (COTs) 20-22 arranged are each similarly configured. Accordingly hereinafter resist application process unit (COT) 20 will be described representatively to describe their configuration.

Figure 4:
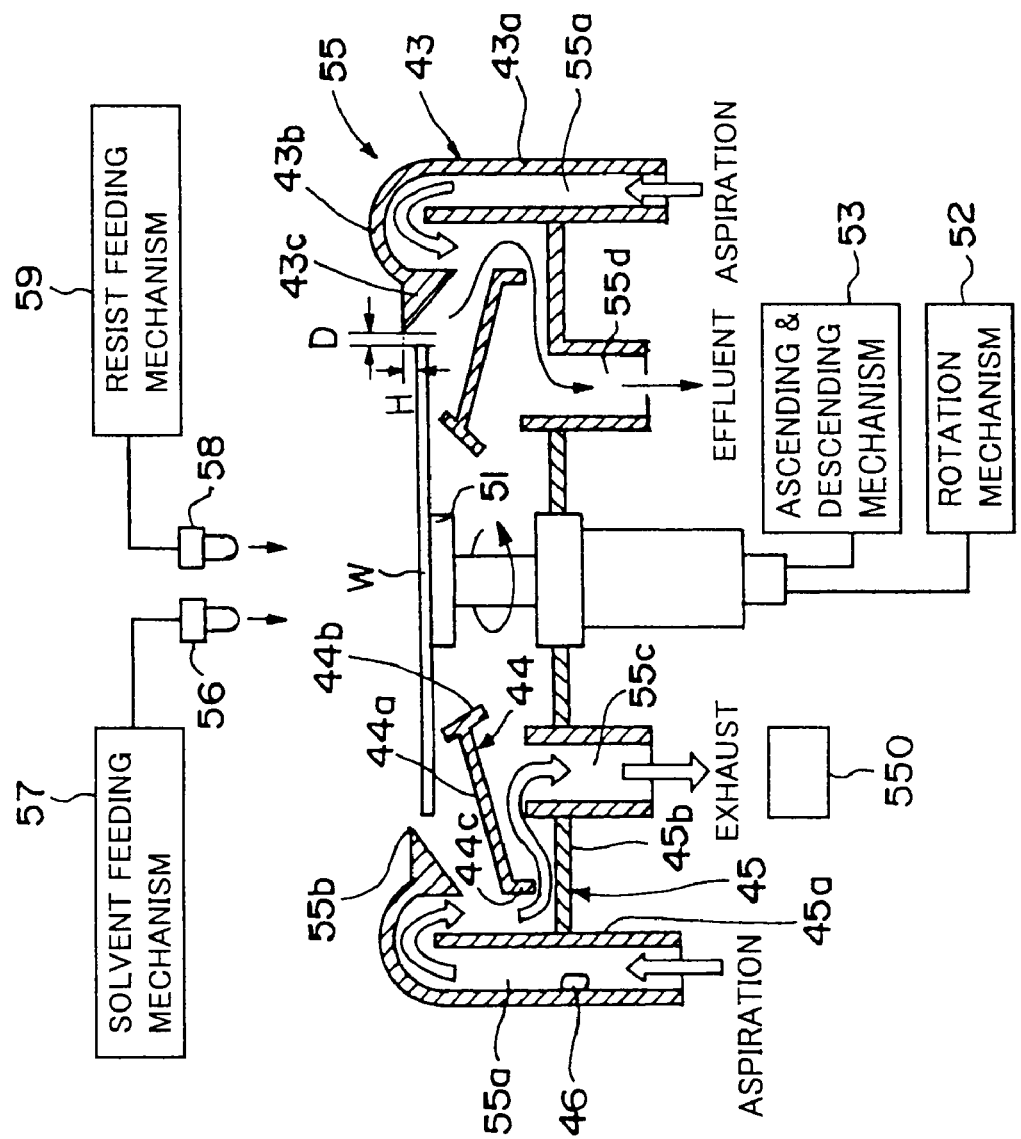
FIGS. 4 and 5 are cross sections schematically showing configurations of a resist application process unit serving as the present apparatus in first and second embodiments, respectively.

As shown in FIG. 4, resist application process unit (COT) 20 includes a spin chuck 51 holding wafer W substantially horizontally, a rotation mechanism 52 rotating spin chuck 51, an ascending and descending mechanism 53 causing spin chuck 51 to ascend and descend, and a processing cup 55 accommodating spin chuck 51.

Note that spin chuck 51 and rotation mechanism 52 configure a substrate holding and rotating device.

Furthermore spin chuck 51 is adapted such that an aspiration mechanism (not shown) operates to produce a vacuum to chuck wafer W and thus allow the spin chuck to hold the wafer. Furthermore, from above processing cup 55, a filter fan unit (FFU) (not shown) feeds clean air in a downward flow toward wafer W.

Furthermore, above wafer W, a nozzle 56 dropping thinner or a similar solvent as a solvent for the resist liquid is provided to be movable by a movement mechanism (not shown) horizontally and vertically, and nozzle 56 is fed with the solvent by solvent feeding mechanism 57. As well as nozzle 56, above wafer W, a nozzle 58 is provided to be movable by a movement mechanism (not shown) horizontally and vertically and fed with the resist liquid by resist feeding mechanism 59. Note that resist feeding mechanism 59 and nozzle 58 together configure a device feeding an applied liquid.

Processing cup 55 includes an outer peripheral member 43 arranged to surround an outer side of wafer W, an air stream controlling member 44 arranged internal to outer peripheral member 43 under and adjacent to wafer W and surrounding spin chuck 51, and an internal cup 45 arranged internal to outer peripheral member 43 below air stream controlling member 44.

Outer peripheral member 43 is defined by a first vertical wall 43a in the form of a cylinder, a ceiling portion 43b provided at an upper portion of the first vertical wall 43a and extending inward therefrom, and an inner peripheral portion 43c formed integral with an inner perimeter of ceiling portion 43b and having an internal wall surface inclined outward and downward. Note that inner peripheral portion 43c defines an opening 55b for introducing and ejecting wafer W into and from processing cup 55.

Air stream controlling member 44 is formed in an annulus surrounding spin chuck 51 and is defined by a first wall 44a, a second wall 44b and a third wall 44c provided to form an exhaust flow path. Note that the first wall 44a has an outer side inclined downward to guide into internal cup 45 the resist liquid recovered in processing cup 55. Furthermore, the third wall 44c is provided to form the exhaust flow path.

Furthermore, internal cup 45 is defined by a second vertical wall 45a formed in the form of a cylinder inner than the first vertical wall 43a of outer peripheral member 43 and cooperating with the first vertical wall 43a to define an external-air aspiration port 55a, and a bottom portion 45b provided inside from a lower end of the second vertical wall 45a. Furthermore, bottom portion 45b is provided with an exhaust port 55c for exhausting mist formed in processing cup 55, and an effluent port 55d for discharging the resist liquid recovered in internal cup 45.

Furthermore when wafer W is accommodated in processing cup 55 thus formed, wafer W is arranged with its perimeter spaced from opening 55b by a predetermined gap. More specifically, as shown in FIG. 4, wafer W is arranged such that the substrate is spaced by a radial gap of at most 3 mm and a vertical gap within a range of 0.5 mm to 2 mm and the substrate has its perimeter lower in level than the opening of the processing cup.

Thus the liquid to be applied that is spun away and thus scattering in processing cup 55 impinges on processing cup 55 at inner peripheral portion 43c and is thus recovered in processing cup 55.

Furthermore, an unnecessary atmosphere containing the resist liquid that has formed mist in processing cup 55 is slightly aspirated through the gap formed between opening 55b and the perimeter of wafer W, and thus will not leak above wafer W. An atmosphere present above the substrate is also aspirated through the gap, although it is aspirated in a significantly small amount. As such, the liquid applied on the substrate at the perimeter will not be dried faster than that applied on the substrate at the other portions.

Furthermore, downstream of exhaust port 55c, there is provided an aspiration device 550 (not shown). When the aspiration device is driven, an exhaust flow path is formed under wafer W from aspiration port 55a to exhaust port 55c.

Furthermore, as the gap and the exhaust flow path communicate with each other, the mist formed in processing cup 55 passes through the exhaust flow path together with external air aspirated through aspiration port 55a and is exhausted through exhaust port 55c.

Furthermore a flowmeter 46 measuring a flow rate is provided internal to aspiration port 55a as a sensor sensing the amount of air aspirated. More specifically, flowmeter 46 is provided upstream in the exhaust flow path and adapted to be prevented from contamination by the mist. Note that, as aforementioned, as the gap draws air in a small amount, the air aspirated and the air exhausted are substantially equal in flow rate.

Thus, as the exhaust flow rate can substantially be measured by flowmeter 46, an exhaust flow rate sensor can be installed upstream of a portion at which the mist is generated, and an error in measurement attributed to a mist adhering on the sensor portion can be prevented, allowing an amount of exhaust to be monitored more precisely. In such configuration when the first transport device 10 shown in FIG. 1 transports wafer W to resist application process unit (COT) 20, wafer W is chucked substantially horizontally on spin chuck 51 moved by ascending and descending mechanism 53 upward.

Wafer W chucked on spin chuck 51 is moved by ascending and descending mechanism 53 into processing cup 55 and thus accommodated therein and a predetermined amount of a solvent is dropped through nozzle 56 on the upper surface of wafer W at the center. Subsequently, spin chuck 51 is rotated by rotation mechanism 52 to disperse on wafer W the solvent dropped on wafer W.

While the solvent is being dispersed, the resist liquid is dropped through nozzle 58 and dispersed, with a film of the solvent interposed, to form a film of the resist on wafer W.

Note that at that time, the resist liquid that is scattered from wafer W therearound and thus excessive is recovered by processing cup 55 and partially forms a mist in processing cup 55.

In processing cup 55, as aspiration device 550 is driven, the exhaust flow path extending from aspiration port 55a to exhaust port 55c is formed. The mist formed in processing cup 55 passes through the exhaust flow path as an unnecessary atmosphere together with external air aspirated through aspiration port 55a and is thus exhausted through exhaust port 55c.

Thus the present invention in the first embodiment allows opening 55b and the perimeter of wafer W to have only a small distance therebetween and separates a processing space located above wafer W in which resist is applied on wafer W and a space located below wafer W for exhaust and effluent. Thus the applied liquid that is spun away from the perimeter of the substrate can be recovered in the processing cup and the mist formed in processing cup 55 that leaks above wafer W can be reduced or prevented.

Furthermore, aspiration port 55a for aspirating external air into processing cup 55, and exhaust port 55c for exhausting outside processing cup 55 are provided. An exhaust flow path can thus be formed in processing cup 55, and a mist produced in forming the film to be applied can be exhausted even with small aspiration.

Furthermore, as an exhaust flow path is formed, as described above, there is not external air intensely flowing in from opening 55 as air is exhausted, and wafer W at the perimeter can have resist less dried. A film of the resist that is extremely uniform in thickness can thus be obtained.

Furthermore, flowmeter 46 that is arranged in aspiration port 55a located upstream in the exhaust flow path can be protected from contamination by the mist and thus measure an amount of exhaust with high precision. Furthermore, no contamination contributes to reduced cost for maintenance.

A second embodiment of the resist application process unit corresponding to the apparatus forming an applied film in accordance with the present invention, will be described hereinafter. Note that in FIG. 5 the portion identical in configuration to the first embodiment of the resist application process unit (COT) described with reference to FIG. 4 is identically denoted and its specific description will not be repeated.

Figure 5:
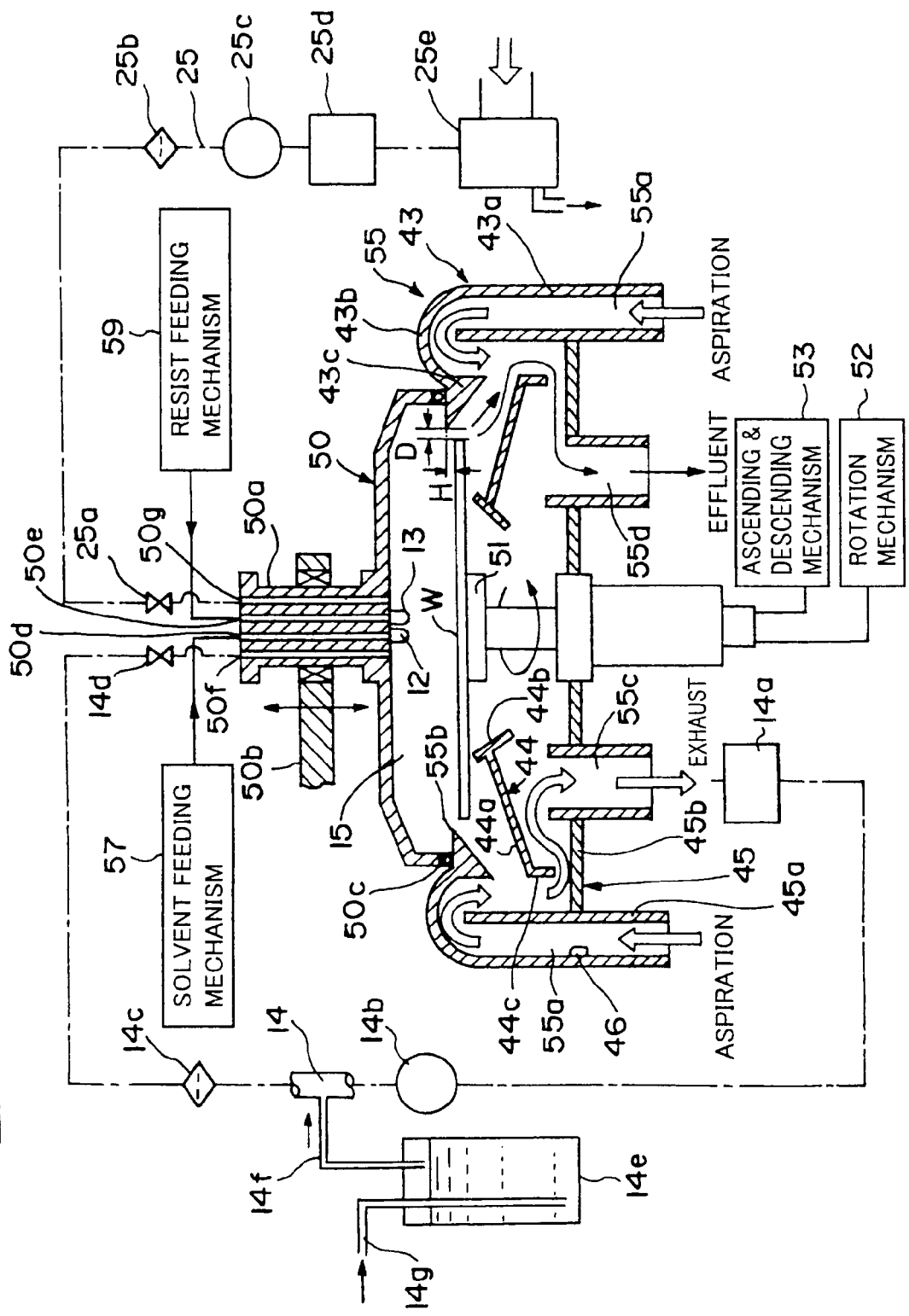

Resist application process unit (COT) 20 shown in FIG. 5 differs from the configuration of the first embodiment shown in FIG. 4 in that the application process is performed in a processing space having a sealed structure. More specifically, in the configuration of FIG. 5, in addition to the configuration of spin chuck 51 and processing cup 55 shown in FIG. 4, a lid 50 is provided to prevent processing cup 55 from having an upper portion open, and they configure a main portion.

Lid 50 is formed in a dome having an upper center provided with an axial portion 50a having a plurality of ducts. Axial portion 50a is suspended by a suspension arm 50b ascending and descending as controlled by an ascending and descending mechanism (not shown). More specifically, as suspension arm 50b ascends and descends, lid 50 is vertically moved relative to an upper portion of processing cup 55 and thus operated to open and close as a lid. Note that lid 50 has a lower perimeter provided with an O ring or a similar sealing member 50c so that when lid 50 contacts (or engages with) processing cup 55 an internal processing space is sealed.

Furthermore, axial portion 50a has a first solvent feeding path 50d connected to a solvent feeding mechanism 57 feeding a solvent, and a resist liquid feeding path 50e connected to a resist feeding mechanism 59 feeding resist liquid. The first solvent feeding path 50d has an end provided with a nozzle 12 for dropping the solvent onto wafer W and resist liquid feeding path 50e has an end provided with a nozzle 13 for dropping the resist liquid onto wafer W. Note that resist feeding mechanism 59, resist liquid feeding path 50e and nozzle 13 together configure a device feeding liquid to be applied.

Furthermore, axial portion 50a also has a second solvent feeding path 50f and a dry air feeding path 50g connected to a circulation path 14 and a dry air feeding duct 25, respectively.

In this example, circulation duct 14 is connected to the second solvent feeding path 50f and exhaust port 55c with a gas-liquid separator 14a, an air blowing fan 14b, a filter 14c and a valve 14d interposed therebetween.

Furthermore circulation duct 14 between air blowing fan 14b and filter 14c is connected to a discharging pipe 14f connecting to a tank 14e accommodating a solvent such as thinner B for the resist liquid. Furthermore, tank 14e is connected to a source of carrier gas (not shown) via a carrier gas feeding pipe 14g.

Thus an atmosphere control device is configured. The source of carrier gas feeds thinner B in tank 14e with a carrier gas, such as He gas, which allows thinner B to flow into circulation duct 14. In circulation duct 14 air flows, which allows thinner B to form a mist and be fed to processing space 15.

Dry-air feeding duct 25 is connected to a dry-air feeding path 50g and a dehumidifier 25e with a valve 25a, a filter 25b, an air blowing fan 25c and a temperature controller 25d interposed therebetween.

In this configuration dehumidifier 25e dehumidifies air to have a predetermined humidity for example of 40% or lower and temperature controller 25d controls the dehumidified air to have a predetermined temperature, e.g., room temperature (approximately 23° C.). The air thus dehumidified and controlled in temperature is fed to processing space 15.

Resist application process unit 20 configured as described above performs a resist application process, as described hereinafter.

Initially, lid 50 is moved upward, while wafer W is loaded, and substantially horizontally chucked on spin chuck 51 moved upward by ascending and descending mechanism 53.

Wafer W chucked on spin chuck 51 is moved by ascending and descending mechanism 53 into processing cup 55 and receives on an upper surface at the center a predetermined amount of a solvent dropped through nozzle 12. Spin chuck 51 is then rotated by rotation mechanism 52 and the solvent dropped on wafer W is dispersed on wafer W, and while the solvent is being dispersed, the resist liquid is dropped through nozzle 13.

Furthermore, simultaneously, lid 50 descends to seal processing cup 55 to form processing space 15 and the thinner fed into circulation duct 14 in the form of a mist is also fed through the second solvent feeding path 50f into processing space 15, and in that condition the resist liquid is dispersed across the surface of wafer W.

After the resist liquid is dispersed across the surface of wafer W, valve 14d is closed and simultaneously valve 25a is opened to feed dry air into processing space 15 to clear processing space 15 of the atmosphere of the thinner. Alternatively, rather than feeding processing space 15 with dry air, lid 50 may be moved upward to clear processing space 15 of the atmosphere of the thinner. At the same time as the atmosphere is cleared away, wafer W is dried as it is spun to form a film of the resist.

Note that in the resist liquid dispersion process wafer W scatters around an excessive amount of the resist liquid, which is recovered by processing cup 55 and partially forms a mist in processing cup 55.

In processing cup 55, as an aspiration device (not shown) is driven, an exhaust flow path is formed to extend from aspiration port 55a to exhaust port 55c. The mist formed in processing cup 55 passes through the exhaust flow path as an unnecessary atmosphere together with external air aspirated through aspiration port 55a and is thus exhausted through exhaust port 55c.

Thus the present invention in the second embodiment allows resist liquid to be dispersed on a surface of wafer W in a sealed processing space with a processing atmosphere fed with a solvent (a thinner) for the resist liquid in the form of a mist to suppress evaporation of the solvent dispersed and thus prevent a substrate from having a perimeter with the dispersed resist liquid dried and thus solidified thereon.

Thus in addition to the effect obtained in the first embodiment the resist liquid can form a film more uniform in thickness, and the resist liquid can also be reduced in amount for use and exhaust and effluent can also be reduced in amount.

Note that, as has been described in the first and second embodiments, aspiration port 55a is provided with flowmeter 46. If an aspiration device performing aspiration through exhaust port 55c is not driven and thus stops, however, there is a possibility that processing cup 55 may have the mist remaining therein and thus flowing back into aspiration port 55a and contaminating flowmeter 46.

Figure 6:
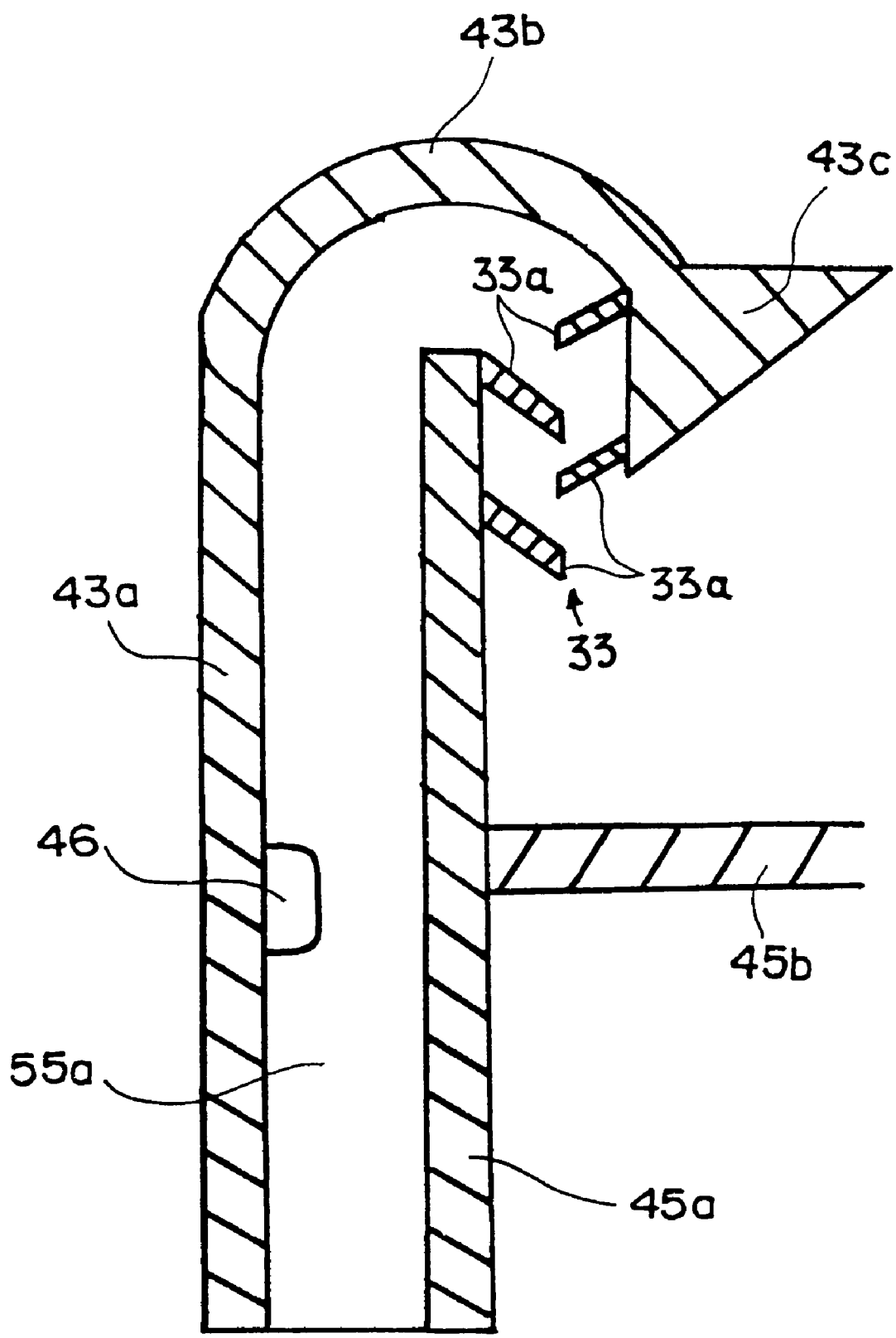
FIG. 6 is a partially enlarged view of another embodiment around an aspiration port.
Figure 7:
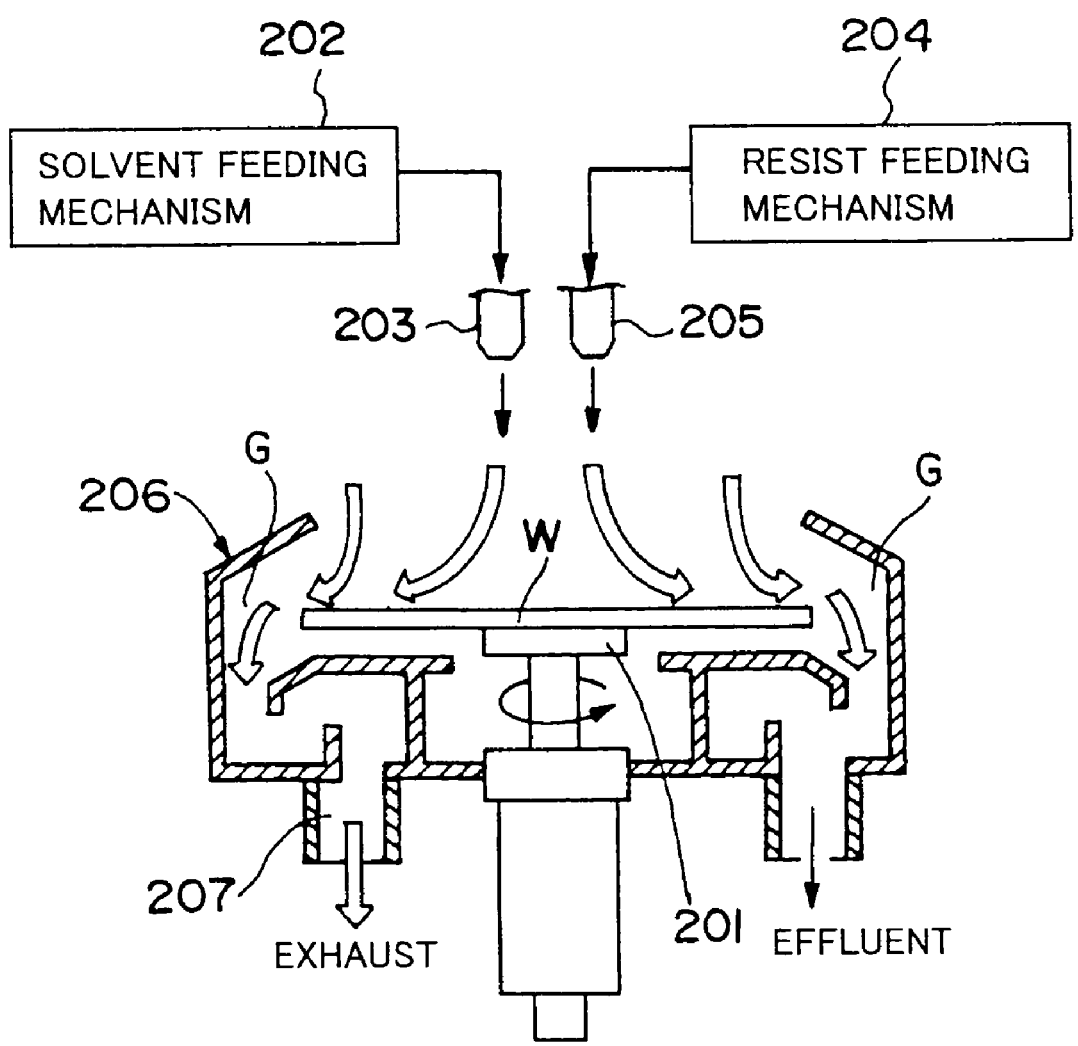
FIG. 7 is a cross section schematically showing a configuration of an apparatus forming an applied film, as conventional.

Accordingly, as shown in FIG. 6 showing an enlarged view of a vicinity of aspiration port 55a, a back flow preventing portion 33 is preferably provided that is formed of a plurality of air stream controlling plates 33a positioned in the exhaust flow path downstream of flowmeter 46 and inclined such that it does not affect aspirating external air and suppresses the mist that flows backward. Backflow preventing portion 33 further ensures that flowmeter 46 is protected against contamination.

Furthermore while the aforementioned embodiments have been described such that a substrate to be processed is a semiconductor wafer by way of example, the present invention may be applied to a substrate other than a semiconductor wafer and is applicable to a LCD substrate, a CD substrate, a glass substrate, a photomask, a printed circuit board and the like.

The present invention is applicable for example to a resist application process unit processing a semiconductor wafer or a similar substrate and can suitably be employed in the industries of semiconductor production, electronic device fabrication and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming an applied film, dropping on a substrate a liquid to be applied thereon, and rotating said substrate to cause a force to disperse said liquid in a form of a film to form a film applied on an upper surface of said substrate, comprising the steps of:
   holding said substrate substantially horizontally on a substrate holding and rotating device accommodated in a processing cup having an opening that opens upward to allow said substrate to be loaded and unloaded;
   dropping said liquid on an upper surface of said substrate rotating on said substrate holding and rotating device;
   aspirating an external air through an aspiration port on said processing cup and located below said substrate held on said substrate holding and rotating device, and
   exhausting an unnecessary atmosphere produced in forming said film applied on said substrate and said external air through an exhaust port on said processing cup,
   wherein the step of exhausting is performed such that a processing space located above said substrate and a space located below said substrate are substantially separated,
   wherein a perimeter of said substrate held on said substrate holding and rotating device is spaced from said opening of the processing cup by a predetermined gap,
   wherein, below said substrate held on said substrate holding and rotating device, an exhaust flow path extends from said aspiration port to said exhaust port, by an aspirating device provided on said exhaust port, said gap and said exhaust flow path communicating with each other, and
   wherein the exhaust port is arranged internally with respect to the aspiration port.

2. The method according to claim 1, wherein the step of dropping said liquid is performed such that said processing space located above said substrate is substantially sealed.

3. The method according to claim 2, wherein the step of dropping includes the step of feeding said processing space with a solvent for said liquid in a form of a mist, and
   wherein, with said solvent fed in said mist, said liquid is dispersed as said substrate is rotated.

4. The method according to claim 1, wherein said aspiration port includes a sensor measuring aspirated air in flow rate.

5. The method according to claim 4, wherein said exhaust flow path includes back flow preventing means disposed downstream of said sensor for preventing said unnecessary atmosphere from flowing backward into said aspiration port.

6. The method according to claim 5, wherein the back flow preventing means includes an inclined plate disposed in the aspiration port.

* * * * *